US008441765B2

(12) United States Patent (10) Patent No.: US 8,441,765 B2
Barbier et al. (45) Date of Patent: May 14, 2013

(54) ELECTROSTATIC DISCHARGE PROTECTED DEVICE

(75) Inventors: Frederic F. Barbier, Vimont (FR); Fabrice Blanc, Zurich (CH); Guy Imbert, Hermanville sur Mer (FR); Denis Raoulx, Caen (FR)

(73) Assignee: NXP B.V., Eindhoven (NL)

( * ) Notice: Subject to any disclaimer, the term of this patent is extended or adjusted under 35 U.S.C. 154(b) by 704 days.

(21) Appl. No.: 11/721,431

(22) PCT Filed: Dec. 8, 2005

(86) PCT No.: PCT/IB2005/054122
§ 371 (c)(1),
(2), (4) Date: Jul. 7, 2009

(87) PCT Pub. No.: WO2006/061793
PCT Pub. Date: Jun. 15, 2006

(65) Prior Publication Data
US 2009/0303644 A1 Dec. 10, 2009

(30) Foreign Application Priority Data

Dec. 10, 2004 (EP) .................................. 04300879

(51) Int. Cl.
*H02H 9/00* (2006.01)
(52) U.S. Cl.
USPC ........................................................... 361/56
(58) Field of Classification Search .................. 361/56, 361/111
See application file for complete search history.

(56) References Cited

U.S. PATENT DOCUMENTS

| 5,452,171 | A | 9/1995 | Metz et al. |
| 5,986,307 | A | 11/1999 | Yu |
| 6,850,397 | B2 * | 2/2005 | Russ et al. .................... 361/91.8 |
| 7,589,944 | B2 * | 9/2009 | Mergens et al. ................ 361/56 |
| 2001/0007521 | A1 | 7/2001 | Chen |
| 2003/0076636 | A1 | 4/2003 | Ker et al. |
| 2004/0021998 | A1 | 2/2004 | Salome et al. |
| 2004/0164356 | A1 * | 8/2004 | Josef Mergens et al. ..... 257/360 |
| 2006/0091464 | A1 * | 5/2006 | Hiraoka ........................ 257/355 |

OTHER PUBLICATIONS

Watt, J. T; et al "A Hot-Carrier Triggered SCR for Smart Power Bus ESD Protection" International Electronic Devices Meeting, 1995. Dec. 10, 1995, pp. 41-344.
Duvvury, C; et al "State-Of-The-Art Issues for Technology and Circuit Design of ESD Protection in CMOS ICS" Semiconductor Science and Technology, IOP, Bristol, GB, vol. 11, No. 6, Jun. 1, 1996, pp. 833-850.
Fankhauser, B; et al "Using Device Simulations to Optimize ESD Protection Circuits" 2004 International Symposium on Electromagnetic Compatibility, vol. 3, Aug. 13, 2004, pp. 963-968.

* cited by examiner

*Primary Examiner* — Rexford Barnie
*Assistant Examiner* — Christopher Clark

(57) ABSTRACT

An electrostatic discharge (ESD) protected device includes a device (6) to be protected and an ESD protection circuit (4). It is determined that if an ESD pulse is applied to pad (2) a leakage current flows on path (14) through the device (6). This leakage current of the device to be protected (6) is used as a precursor trigger signal to trigger the ESD device (4).

11 Claims, 1 Drawing Sheet

ELECTROSTATIC DISCHARGE PROTECTED DEVICE

Figure 1:
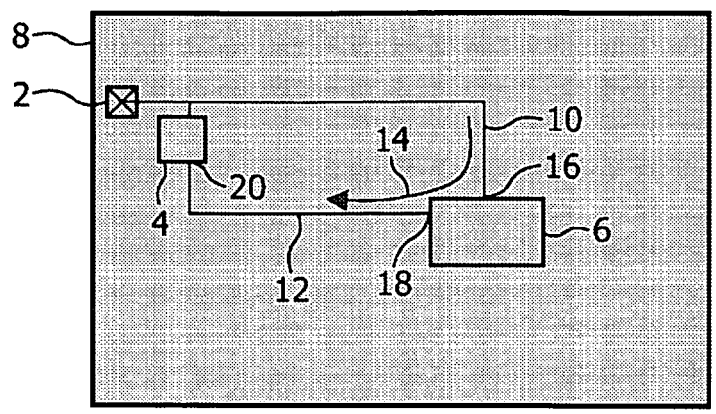

The invention relates to a device protected against electrostatic discharge and a method of protecting the device.

Protection against electrostatic discharge (ESD) may be integrated onto a chip, especially an integrated circuit, by providing a low impedance channel to ground to prevent thermal damage in silicon. Alternatively, the voltage pulse of any ESD may be clamped to a safe level.

Devices may be tested for resistance to ESD by Human Body Model (HBM) testing. HBM testing is designed to simulate the voltage pulses that can be discharged from the fingertip of a human being. Specified voltage pulses are applied to an input terminal of a semiconductor device, and the test determines whether the device is protected from damage by such pulses. The device is determined to withstand the voltage pulse if it still operates within predetermined limits after the pulse. The voltage of the voltage pulse is increased, and the voltage withstood by the device may be considered to be a measure of the resistance of the device to electrostatic discharge. Devices with HBM values of 2000V are often considered to be reasonably resistant to ESD, though requirements vary. Higher HBM values are generally preferred.

A silicon controlled rectifier (SCR) may be used as an ESD protection structure integrated onto the device substrate of the integrated circuit. Unfortunately, these can be slow to react to ESD pulses on the pins of the integrated circuit device.

There is therefore a need to improve the identification and triggering of an ESD event.

Many studies have been made of how best to trigger an ESD event. One approach is to detect a voltage level using for example a Zener diode or a series of diodes in a cascaded arrangement to detect the voltage pulse. An alternative approach is to detect a rapidly changing voltage using a resistor-capacitor (RC) circuit as a trigger. More complex networks have been proposed to generate a signal when an ESD event is detected. However, there remains a need for rapid triggering of ESD protection.

A prior art SCR protection circuit is described in US2001/0007521.

According to the invention there is provided an ESD protected device, comprising:
an input pad;
a device to be protected having a first device terminal connected to the input pad, and a critical electrostatic discharge leakage path from the first device terminal through the device to be protected to a second device terminal;
an electrostatic discharge protection circuit connected to the input pad having a trigger terminal for triggering electrostatic discharge protection;
wherein the second device terminal is connected to the trigger terminal so that leakage current in the device to be protected triggers or assists in triggering electrostatic discharge protection.

The inventors have realised that it is not necessary to trigger ESD protection based on the ESD voltage pulse, but instead it is possible to detect the leakage current in the device to be protected and use this to trigger the ESD protection. This can improve the detection speed.

The inventors do not wish to be bound by theory but it is considered that the leakage current in the stressed device acts as a precursor to full discharge thus improving triggering speed.

Unlike the arrangement in the previously mentioned patent application (US2001/007521) which describes an integral ESD protection circuit, the invention uses a leakage current in the device to be protected, not in the protection circuit, to assist in triggering a separate ESD protection circuit.

The electrostatic discharge protection circuit may be arranged on a single substrate with the electrostatic discharge protection circuit arranged adjacent to the input pad and the device to be protected arranged spaced further from the input pad than the electrostatic discharge protection circuit. In particular, it is possible for the device to be protected to be arranged in the interior of the substrate area. By having the device to be protected arranged further from the pad than the ESD protection circuit the ESD protection circuit can effectively dissipate an ESD pulse without that pulse passing through the device to be protected. The second device terminal may be connected to the trigger terminal by a current trigger line. This current trigger line may be provided as part of a long distance interconnection layer on the substrate, a short distance layer or as a separate layer.

Preferably, the ESD protection circuit should be placed as close as possible to the pad in order to be the preferred path for the ESD.

In embodiments, the electrostatic discharge protection circuit is a silicon controlled rectifier connected to the input pin.

In embodiments the silicon controlled rectifier comprises:
a first node connected to the input pad;
a second node connected to ground;
a first resistor connected between the first node and a third node;
a first bipolar transistor connected with the collector and emitter between the third node and the second node, the base of the bipolar transistor being connected to a fourth node;
a second resistor connected between the fourth node and the second node;
a second bipolar transistor connected with collector and emitter between the first node and the fourth node, and the base connected to the third node;
wherein the trigger terminal is connected to the fourth node.

The device to be protected may be a field effect transistor (FET) having source, gate and drain, one of the source and drain being the first device terminal connected to the input pad and the gate being the second device terminal connected to the electrostatic discharge protection circuit.

In another aspect, there is provided a method of designing and manufacturing an ESD protected device, the method comprising:
providing a first instance of a device to be protected on a substrate connected to an input pad by a connecting line;
applying an electrostatic discharge to the input pad to cause an electrostatic discharge current to flow though the device to be protected;
identifying the critical electrostatic discharge current path as flowing from a first device terminal of the device to be protected to a second device terminal;
manufacturing an ESD protected device including a second instance of a device to be protected on a substrate connected to an input pad by a connecting line and further including an ESD protection circuit having a trigger terminal connected to the second device terminal such that the identified critical current flow flows from the input pad into the device to be protected and out of the second device terminal and from there into the ESD protection circuit to assist in triggering the ESD protection circuit.

Figure 2:
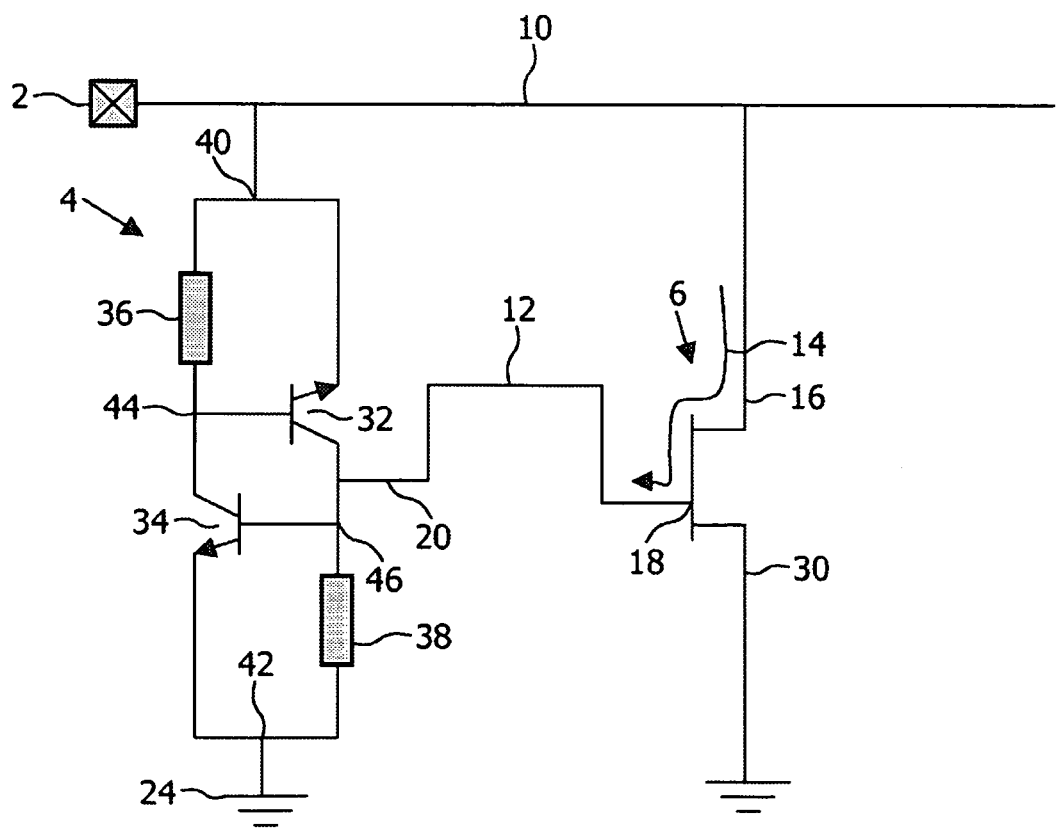

For a better understanding of the invention, an embodiment will now be described, purely by way of example, with reference to the accompanying drawings in which:

FIG. 1 shows a top view of a first embodiment of an ESD protected device according to a first embodiment of the invention; and FIG. 2 is a circuit diagram of an ESD protected device according to a second embodiment of the invention.

The drawings are purely schematic and not to scale. Like components are given the same reference numerals in different figures.

A semiconductor device has an input pad 2. Note that although FIG. 1 only shows one input pad, there may in general be many more. A device 6 to be protected is connected to the input pad 2. In the example, the device 6 is connected directly between the input pad 2 and ground 24, but in other arrangements there may be other components and configurations of the device 6.

An ESD protection circuit 4 is also connected to pad 2. In the example, this ESD protection circuit is an SCR type circuit though the invention also works with other suitable circuits.

The ESD protection circuit 4 is integrated onto the same substrate 8 as the input pad 2 and the device 6. The device 6 is arranged, in the example, away from the edge of the substrate 8. The input pad 2 is arranged for convenience at the edge of the substrate 8, and the ESD protection circuit 4 is arranged close to the input pad 2 so that it can discharge an ESD at the pad without damaging the device 6. The input pad 2 is connected to the device 6 by input line 10 which is an electrical interconnect.

The leakage current path 14 of the device 6 is identified by carrying out an experiment to find the critical electrostatic discharge critical path. The critical ESD discharge path is the path of current flow that causes damage. For example, in the example described the gate/drain junction failed allowing a current path between gate and drain when the device fails. In this context, "fails" means that unacceptable leakage between gate and drain occurs. Thus, the critical current ESD discharge path is the path from gate to drain.

The experiment may involve applying an ESD discharge to a first instance of the device 6 on substrate 8, without line 12 connecting the ESD protection circuit 4 to the device 6, and optionally also without the ESD protection circuit entirely. Then, an ESD may be applied to the pad so that it passes through the device 6 causing damage. The device 6 may then be investigated to identify the current path. Since the current path of the discharge is typically destructive, the current flow path should be identifiable.

The leakage current path is the path from input pad 2 through the device 6 from the input terminal 16 out of the device through terminal 18 of the device. Terminal 18 of the device is connected by interconnection line 12 to the trigger terminal 20, so that in the event that leakage current occurs it is delivered to the trigger terminal 20.

In the embodiment, the ESD protection circuit 4 is arranged to trigger normally when a large voltage pulse occurs on the pad. A leakage current applied at trigger terminal 20 of the ESD protection circuit 4 can also trigger the circuit to dissipate the voltage applied to the pad. Both mechanisms for triggering can cooperate, the leakage current improving triggering by a voltage pulse. Indeed, if an electrostatic pulse is applied to the input pad 2 the voltage on the pad will rise as will the leakage current through leakage path 14 and so in practice the two trigger mechanisms may both operate together.

The invention can work to protect any suitable device 6 using a variety of types of ESD protection circuit 4.

FIG. 2 illustrates the application of the invention to a particular circuit. The device 6 is a JFET with source 30 connected to ground 24, the drain lo acting as the input terminal 16 connected to the input pad 2 and the gate acting as the terminal 18 through which the leakage current passes.

The inventors have investigated the critical ESD path 14 for this device experimentally as set out above and determined it to be from the drain to the gate of the JFET.

The ESD protection circuit in the embodiment is an SCR circuit connected between the input line 10 near the input pad 2 and ground 24. An npn bipolar transistor 32 and a pnp bipolar transistor 34 are used together with first resistor 36 and second resistor 38.

In detail, first node 40 is connected to the input pad 2 and second node 42 to earth 24. First resistor 36 is connected between first node 40 and third node 44. The pnp bipolar transistor 34 is connected with its collector connected to third node 44, emitter connected to the second node 42 and its base connected to fourth node 46. The npn bipolar transistor 32 is connected with its collector connected to fourth node 46, its base to second node 44, and its emitter to first node 40.

The fourth node 46 is connected to ESD input terminal 20.

In use, leakage current from JFET 6 is applied at fourth node 46 to turn on the pnp transistor 34 which in turn draws current through first resistor 36 turning the npn transistor 32 on. Thus, the leakage current can turn both bipolar transistors 32, 34 on allowing an electrostatic discharge on pad 2 to be discharged through the ESD protection circuit 4 to ensure that device 6 remains intact. In practice, this effect cooperates with the usual turn-on of an SCR ESD protection circuit 4 to speed up turn on of the protection circuit. This improved triggering reduces the energy dissipated in device 6 from any given ESD and hence improves the resistance of the integrated circuit to ESD.

Experiments were carried out on a device of this type protecting a JFET using an SCR. An HBM voltage in excess of 7kV was obtained. In a comparative example, experiments were carried out on a device in which the critical ESD path of the JFET was not connected to the SCR. In this example, an HBM voltage of 250V was obtained. Thus, a greatly improved HBM voltage was obtained using the invention.

Although specific embodiments have been described, the invention is not limited to these embodiments and the invention can be applied to other devices and discharge circuits.

The technique can for example be used to trigger an NPN bipolar transistor acting as an ESD protection device. The current line 12 may be connected to the base of the bipolar transistor to turn the transistor on more rapidly. Alternatively, the ESD protection device need not be a conventional ESD protection device but a high-power device which may be switched on by a signal on current line 12. The high power device could be for example a Darlington stage using bipolar transistors, or a power MOSFET.

For example, in the specific embodiment the leakage current itself is directly injected into the electrostatic protection device. This is simple, rapid and does not require excessive additional circuitry. However, in alternative embodiments, the leakage current may be detected in a detecting circuit element and a signal, for example a voltage signal, fed into the ESD protection circuit 4.

The invention claimed is:
1. An ESD protected device, comprising:
  an input pad;
  a device to be protected having a first device terminal connected to the input pad, and a critical electrostatic discharge leakage path from the first device terminal through the device to be protected to a second device terminal;

an electrostatic discharge protection circuit connected to the input pad having a trigger terminal for triggering electrostatic discharge protection;

wherein the second device terminal is connected to the trigger terminal so that leakage current in the device to be protected triggers or assists in triggering electrostatic discharge protection, wherein the device to be protected is a field effect transistor (FET) having a source, gate and drain, one of the source and drain being the first device terminal connected to the input pad and the gate being the second device terminal directly connected to the trigger terminal of the electrostatic discharge protection circuit, wherein an electrostatic discharge at the input pad is discharged through an electrostatic discharge path, and wherein the electrostatic discharge protection circuit is positioned further upstream in the electrostatic discharge path than the FET.

2. An ESD protected device according to claim 1 on a single semiconductor substrate wherein:
the electrostatic discharge protection circuit is arranged adjacent to the input pad;
the device to be protected is arranged spaced further from the input pad than the electrostatic discharge protection circuit; and
the second device terminal is connected to the trigger terminal by a current trigger line.

3. An ESD protected device according to claim 1 wherein the electrostatic discharge protection circuit is a silicon controlled rectifier connected to the input pin.

4. An ESD protected device according to claim 3 wherein the silicon controlled rectifier comprises:
a first node connected to the input pad;
a second node connected to ground;
a first resistor connected between the first node and a third node;
a first bipolar transistor connected with its collector and emitter between the third node and the second node, the base of the first bipolar transistor being connected to a fourth node;
a second resistor connected between the fourth node and the second node;
a second bipolar transistor connected with its collector and emitter between the first node and the fourth node, and the base connected to the third node, one of the first and second bipolar transistors being an npn transistor and the other of the first and second bipolar transistors being a pnp transistor;
wherein the trigger terminal is connected to the third node or to the fourth node.

5. A method of designing and manufacturing an ESD protected device, the method comprising:
providing a device to be protected on a substrate connected to an input pad by a connecting line;
applying an electrostatic discharge to the input pad to cause an electrostatic discharge current to flow though the device to be protected;
identifying a critical electrostatic discharge current path as flowing from a first device terminal of the device to be protected to a second device terminal;
providing an ESD protection circuit having a trigger terminal connected to the second device terminal such that the identified critical current flow flows from the input pad into the device to be protected and out of the second device terminal which is connected directly to the ESD protection circuit to assist in triggering the ESD protection circuit,
wherein the ESD protected device is a field effect transistor (FET) having a source, gate and drain, one of the source and drain being the first device terminal connected to the input pad and the gate being the second device terminal directly connected to the trigger terminal of the ESD protection circuit, wherein applying the electrostatic discharge to the input pad includes applying the electrostatic discharge to the input pad to cause the electrostatic discharge to be discharged through an electrostatic discharge path, and wherein the ESD protection circuit is positioned further upstream in the electrostatic discharge path than the FET.

6. A method according to claim 5 wherein in the step of manufacturing an ESD protected device the second device terminal is connected to the trigger terminal by a current trigger line to pass the leakage current into the ESD protection circuit to assist in triggering the ESD protection circuit.

7. A method according to claim 5 wherein the ESD protection circuit is an SCR circuit.

8. The ESD protected device of claim 1, wherein the gate of the FET is electrically connected to the trigger terminal of the electrostatic discharge protection circuit.

9. The method of claim 5, wherein the gate of the FET is electrically connected to the trigger terminal of the electrostatic discharge protection circuit.

10. The ESD protected device of claim 2, wherein the electrostatic discharge protection circuit is directly connected to the input pad through a first electrical interconnect line, and wherein the FET is directly connected to the input pad through a second electrical interconnect line that is longer than the first electrical interconnect line.

11. The ESD protected device of claim 1, wherein the FET is connected directly to ground.

* * * * *